Figure 1:
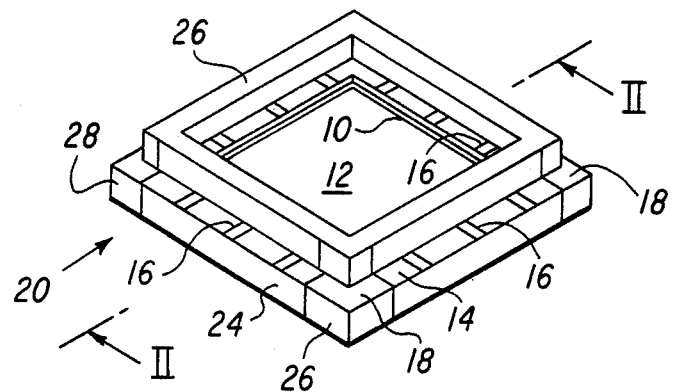

United States Patent [19]
Morris et al.

[11] Patent Number: 4,799,958
[45] Date of Patent: Jan. 24, 1989

[54] METALLIZING PASTE

[75] Inventors: Michael Morris, Sheffield; John Vickers, Ulverston, both of England

[73] Assignee: Oxley Developments Company Limited, London, England

[21] Appl. No.: 924,302

[22] Filed: Oct. 23, 1986

[30] Foreign Application Priority Data

Oct. 25, 1985 [GB] United Kingdom ............... 8526397

[51] Int. Cl.⁴ .................. H01B 1/06; H01C 7/00; C23C 30/00
[52] U.S. Cl. .................. 106/1.12; 252/518; 252/521; 428/210; 427/96
[58] Field of Search ............. 252/518, 521; 106/1.12, 106/193 M; 428/210; 427/96

[56] References Cited

U.S. PATENT DOCUMENTS

| | | | |
|---|---|---|---|
| 3,323,924 | 6/1967 | McRae et al. | 106/1.12 |
| 3,661,595 | 5/1972 | Buck | 106/1.12 |
| 3,962,143 | 6/1976 | Hitch et al. | 252/514 |
| 4,521,250 | 6/1985 | Kuzel et al. | 106/15.05 |
| 4,540,604 | 9/1985 | Siuta | 427/96 |
| 4,551,357 | 11/1985 | Takeuchi | 427/96 |
| 4,733,018 | 3/1988 | Prabhu et al. | 252/521 |

Primary Examiner—Paul Lieberman
Assistant Examiner—Ronald A. Krasnow
Attorney, Agent, or Firm—John S. Hale

[57] ABSTRACT

A metallizing paste capable of being used for screen printing applications which comprises tungsten powder and an organic vehicle system. The organic vehicle system can comprise a polymeric material, such as ethyl cellulose, and a solvent, such as terpineol. The paste preferably includes frit material, such as one or more of alumina, cerium fluoride, bismuth oxide and silica. The paste may also include manganese and/or nickel.

There is also disclosed a semi-conductor package made using the metallization paste. The package includes a conductive attachment area, conductive feed-through paths, conductive vias and a conductive external underside, all of which are formed using the metallization paste in various formulations.

5 Claims, 1 Drawing Sheet

U.S. Patent     Jan. 24, 1989     4,799,958

METALLIZING PASTE

DESCRIPTION

The invention relates to metallising pastes, and in particular, but not exclusively, to metallising pastes which may be fired at high temperatures.

The use of low-temperature-firing metallising pastes as intermediates in the electroplating of pre-sintered ceramics is widespread, for example, in the manufacture of ceramic packages for mounting a semiconductor device, wherein pastes are screen-printed onto ceramic components of the package. These form a metallic base onto which other metals may be electroplated to provide electrical and thermal contact with the semiconductor device within the package. Many metals may be used in the pastes, for example, silver, nickel and copper.

However, in some applications it would be advantageous if the paste could be deposited on a "green" (i.e. unsintered) ceramic and subsequently co-fired with the ceramic at temperatures up to 1,600° C. However, at such temperatures the known pastes described above do not provide acceptable results.

In accordance with the present invention, there is provided a metallising paste comprising tungsten and an organic vehicle system.

This provides a screen-printable refractory metal formulation which when co-fired with a ceramic (e.g. alumina) or fired onto pre-sintered ceramic yields an adherent, electrically conductive metallised area, upon which a variety of metals may be electroplated.

Preferably, the paste further comprises frit material.

The tungsten may be in the form of a powder, advantageously comprising particles of approximately one micron in size.

The organic vehicle system preferably comprises a polymeric material, e.g. ethyl cellulose, and an appropriate solvent, e.g. terpineol, which are preferably mixed in the ratio 1 to 12 by weight.

The weight of the vehicle system is preferably from 20% to 50%, and more preferably 35%, of the weight of the paste.

The frit material preferably comprises one or more of alumina, cerium fluoride, bismuth oxide and silica, which preferably are present in equal proportions.

The ratio of tungsten to frit in the paste may be from 100 to 0 to 50 to 50 parts by weight. For example, the ratio may be 90 to 10, 60 to 40 or 99 to 1.

Other compositions could contain up to 20% by weight of manganese and/or 10% by weight of nickel, in addition to tungsten and the frit materials.

The advantages of such compositions are that the addition of manganese allows the percentage of non-conductive frit materials within the paste to be reduced since the manganese itself will bond chemically to the ceramic substrate.

The addition of small amounts of nickel is advantageous in that the presence of this metal facilitates the subsequent electrodeless nickel plating of the fired metallisation.

The invention also includes an article formed using a metallising paste in accordance with the invention.

Figure 2:
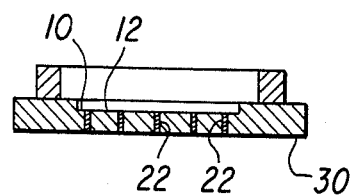

By way of example only, a specific embodiment of the present invention will now be described, with reference to the accompanying drawings and examples, in which:

FIG. 1 is a perspective view of an embodiment of a semiconductor device package formed using a metallising paste in accordance with the present invention; and FIG. 2 is a sectional view on the line II—II in FIG. 1.

EXAMPLE 1

A mixture A according to the present invention comprises 90 parts by weight of high purity tungsten powder, the tungsten powder being 99.9% pure and having an average grain size of one micron. The tungsten powder is mixed with 10 parts by weight of frit material, comprising alumina, cerium fluoride, bismuth oxide and silica in equal proportions by weight. The constituents of the frit material are passed through a 45 micron sieve so that the frit material does not contain particles of size greater than 45 microns. To the mixture of tungsten powder and frit material is added an organic vehicle solution comprising 9 parts by weight of terpineol (which acts as a solvent) and one part by weight of ethyl cellulose which is a polymeric binder material. The resultant mixture A is 70% by weight of tungsten and frit and 30% by weight of vehicle solution. The addition of the vehicle solution forms a metallising paste having viscosity suitable for screen-printing.

EXAMPLES 2 and 3

Mixtures B and C according to the present invention are similar to mixture A, except that mixture B has a minimal proportion of frit material content, in the present case 1 part to 99 parts by weight tungsten powder, and mixture C has a high proportion of frit material, i.e. 40 parts to 60 parts by weight of tungsten in the present case.

It should be appreciated that the amount of frit material in 100 parts by weight of a tungsten and frit mixture, which, with the vehicle system, forms a mixture according to the present invention may be as low as zero parts, as high as 50 parts, and may take any value in between. All such tungsten and frit mixtures as described in Examples 1 to 3, when mixed with vehicle solution, provide a paste which may be screen printed directly onto "green" (i.e. unsintered) alumina and co-fired, in a reducing atmosphere, at 1,500° C. or above, or which may be applied to pre-sintered alumina and fired at temperatures as low as 1,200° C., in both cases to provide adherent, electrically conductive metallised areas upon which a variety of metals may be subsequently electroplated.

It should also be appreciated that the resultant tungsten/frit mixture may comprise from 50% to 80% by weight of the total mixture.

Referring to FIGS. 1 and 2, a semiconductor package device is shown. This comprises a plurality of sheets (not individually visible in the drawings) of alumina, one 10 of which is screen-printed with mixture A to provide a rectangular die attachment area 12. Another sheet 14 of alumina is screen-printed with mixture A to form feedthroughs 16 and horizontal, corner metallisation areas 18.

The sheets of alumina are laminated and co-fired to yield a monolithic structure 20 about which are positioned adherent electrically conductive tungsten metallised areas.

After the structure 20 has been cut to size and suitably lapped, mixture B is introduced into via holes 22 which extend through the base 24 of the structure 20 to the die attachment area 12. When filled with mixture B, the resulting metal structures in the via holes provide good electrical and thermal conductivity between the die attachment area and the undersurface of the structure 20.

Mixture C is screen-printed on the upper surface of the structure 20 to provide a lid attachment area 26, and also on the sides to provide vertical, corner metallisation areas 28 and also on the undersurface 30 of the structure 20.

The whole structure is then re-fired at 1,250° C. in a reducing atmosphere and the metallised areas which remain are finished conventionally, in gold over a nickel undercoat.

We claim:

1. A metallising paste comprising in combination tugsten powder, frit material consisting of equal proportions by weight of alumina, cerium fluoride, bismuth oxide and silica 20–50% by weight based on the total paste of an organic vehicle system;

the ratio to tungsten powder to frit in the paste being in an amount between 50 to 99 parts tungsten powder to 50 to 1 parts of frit material.

2. A metallising paste according to claim 1 wherein the organic vehicle system comprises terpineol and ethyl cellulose, the ratio of terpineol to ethyl cellulose being in an amount between 9 parts terpineol to 1 part ethyl cellulose and 12 parts terpineol to 1 part ethyl cellulose.

3. A metallising paste according to claim 1, further including up to 20% by weight of manganese.

4. A metallising paste according to claim 1, further including up to 10% by weight of nickel.

5. A metallising paste according to claim 1, further including up to 20% by weight of manganese and 10% by weight of nickel.

* * * * *